US012721002B2

(12) United States Patent
Han et al.

(10) Patent No.: US 12,721,002 B2
(45) Date of Patent: Aug. 25, 2026

(54) DISPLAY DEVICE AND METHOD OF MANUFACTURING THE SAME

(71) Applicant: Samsung Display Co., LTD., Yongin-si (KR)

(72) Inventors: Soo Yeon Han, Yongin-si (KR); Kyu-Ho Jung, Yongin-si (KR); Sang-Chul Byun, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 274 days.

(21) Appl. No.: 18/486,452

(22) Filed: Oct. 13, 2023

(65) Prior Publication Data

US 2024/0244925 A1 Jul. 18, 2024

(30) Foreign Application Priority Data

Jan. 18, 2023 (KR) ........................ 10-2023-0007597

(51) Int. Cl.
*H10K 59/80* (2023.01)
*H10K 59/40* (2023.01)

(52) U.S. Cl.
CPC ........... *H10K 59/872* (2023.02); *H10K 59/40* (2023.02); *H10K 59/8792* (2023.02)

(58) Field of Classification Search
CPC .. H10K 59/872; H10K 59/40; H10K 59/8792; H10K 71/40
USPC ........................................................... 257/40
See application file for complete search history.

(56) References Cited

U.S. PATENT DOCUMENTS

| | | | | |
|---|---|---|---|---|
| 9,651,807 | B2 | 5/2017 | Ogawa et al. | |
| 10,096,792 | B2 | 10/2018 | Ahn et al. | |
| 10,658,615 | B2 | 5/2020 | Oh et al. | |
| 10,759,897 | B2 * | 9/2020 | Takenouchi | C08J 7/043 |
| 12,151,456 | B2 * | 11/2024 | Lee | C08G 77/14 |
| 12,185,563 | B2 * | 12/2024 | Lee | H10K 50/8426 |
| 2021/0260846 | A1 | 8/2021 | Kim et al. | |
| 2022/0035409 | A1 | 2/2022 | Heo et al. | |

FOREIGN PATENT DOCUMENTS

| | | | |
|---|---|---|---|
| KR | 20180038576 | A | 4/2018 |
| KR | 20180098445 | A | 9/2018 |
| KR | 20210107197 | A | 9/2021 |
| KR | 20220014453 | A | 2/2022 |
| KR | 102373615 | B1 | 3/2022 |

* cited by examiner

*Primary Examiner* — Tu-Tu V Ho
(74) *Attorney, Agent, or Firm* — CANTOR COLBURN LLP

(57) ABSTRACT

A display device includes a display panel, and a window coating layer having a lower surface in contact with an upper surface of the display panel, and an upper surface opposed to the lower surface, wherein the curing rate of the window coating layer increases along a thickness direction, the lower surface has a curing rate of about 10% to about 50%, and the upper surface has a curing rate of about 98% or less.

20 Claims, 15 Drawing Sheets

DISPLAY DEVICE AND METHOD OF MANUFACTURING THE SAME

This application claims priority to Korean Patent Application No. 10-2023-0007597, filed on Jan. 18, 2023, and all the benefits accruing therefrom under 35 U.S.C. § 119, the entire content of which is herein incorporated by reference.

BACKGROUND

1. Field

The present disclosure herein relates to a display device, and more particularly, to a display device with improved impact resistance, and a method of manufacturing the same.

2. Description of Related Art

A display device provides information to a user by displaying various images on a display screen. A display device displays information within an assigned screen. Recently, a flexible display device including a flexible display panel capable of being folded is being developed. A flexible display device, unlike a flat display device, may be foldable, rollable, or bendable like paper. The flexible display device that is variously deformable may be easily portable and may improve user convenience. The flexible display device may be classified into a rollable display device, a foldable display device, etc.

SUMMARY

The present disclosure provides an embodiment of a display device having improved impact resistance by controlling the curing rate of a lower surface of a window coating layer, and a method of manufacturing the display device.

The present disclosure also provides an embodiment of a display device capable of maintaining impact resistance even when a window coating layer has a smaller thickness, and a method of manufacturing the display device.

The present disclosure also provides an embodiment of a display device enabling lower manufacturing cost of a display device and an improvement of process efficiency, and a method of manufacturing the display device.

An embodiment of the invention provides a display device including a display panel, and a window coating layer including a lower surface in contact with an upper surface of the display panel, and an upper surface opposed to the lower surface, wherein the window coating layer has a curing rate increased along a thickness direction, and the lower surface has a curing rate of about 10% to about 50%, and the upper surface has a curing rate of about 98% or less.

In an embodiment, the window coating layer may be, along the thickness direction, divided into a first region including the lower surface and a second region including the upper surface, the first region may have an elastic modulus of about 1 MPa to about 100 MPa, and the second region may have an elastic modulus of about 1 GPa to about 10 GPa.

In an embodiment, the elastic modulus of the second region may increase toward the upper surface.

In an embodiment, the elastic modulus of the first region may increase toward the second region.

In an embodiment, the window coating layer may be a single layer.

In an embodiment, the window coating layer may have a thickness of about 480 μm to about 630 μm.

In an embodiment, the first region and the second region may include different materials.

In an embodiment, the display panel may include a base layer, a pixel layer disposed on the base layer, and configured to display an image, an input-sensing layer disposed on the pixel layer, and an anti-reflection layer disposed on the pixel layer, at least one of the input-sensing layer or the anti-reflection layer may define an outermost layer of the display panel, and the window coating layer may be directly disposed on an upper surface of the outermost layer of the display panel.

In an embodiment, a method of manufacturing a display device includes applying a resin onto a display panel, and curing the applied resin to provide a window coating layer, and the curing of the applied resin is performed such that a lower surface of the window coating layer, in contact with an upper surface of the display panel, has a curing rate of about 10% to about 50%.

In an embodiment, the curing of the applied resin may include controlling energy transferred to the applied resin.

In an embodiment, in the controlling of energy transferred to the resin, the energy transferred may be controlled so that an upper surface of the window coating layer has a curing rate of about 98% or less.

In an embodiment, in the controlling of energy transferred to a resin, the energy transferred may be controlled so that the curing rate of the window coating layer increases along a direction away from the upper surface of the display panel.

In an embodiment, the lower surface of the window coating layer may have a curing rate of about 50%, and an upper surface of the window coating layer may have a curing rate of about 98%.

In an embodiment, the applying of the resin onto the display panel may include applying a first resin onto the display panel, and applying a second resin onto the first resin to cover the first resin, and the curing of the applied resin may include curing the first resin by transferring energy to the first resin after applying the first resin and before applying the second resin, and curing the second resin by transferring energy to the second resin after applying the second resin.

In an embodiment, the first resin and the second resin may include different materials.

In an embodiment, the energy transferred to the first resin and the energy transferred to the second resin may differ from each other.

In an embodiment, in the curing of the applied resin, the applied resin may be cured through a UV beam, and the energy transferred to the applied resin may change depending on at least one of an intensity of a UV beam applied to the applied resin, a velocity of the UV beam, number of times the UV beam is applied, or a curing time for the applied resin.

In an embodiment, the number of times the UV beam is applied may be at least two.

In an embodiment, a method of manufacturing a display device includes applying a resin onto a display panel, and curing the applied resin to provide a window coating layer that is a single layer, and the curing of the applied resin is performed such that a lower surface of the window coating layer, in contact with an upper surface of the display panel, has a curing rate of about 10% to about 50%, and an upper surface of the window coating layer has a curing rate of about 98% or less.

In an embodiment, in the curing of the applied resin, the curing rate of the window coating layer may increase along a direction away from the upper surface of the display panel.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
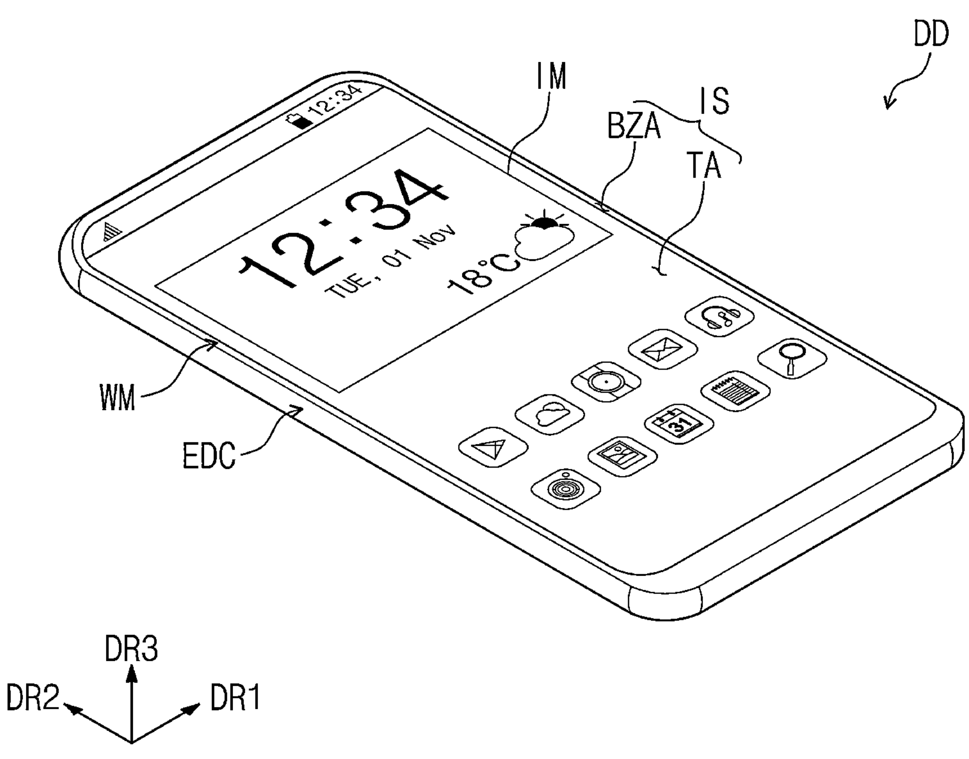
FIG. 1 is a perspective view of a display device according to an embodiment of the invention.

The invention now will be described more fully hereinafter with reference to the accompanying drawings, in which various embodiments are shown. This invention may however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, or the like) is referred to as being related to another such as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

The term "and/or," includes all combinations of one or more of which associated configurations may define.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the inventive concept. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "comprise", "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof. As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment and a method of manufacturing the same will be described with reference to the accompanying drawings.

Figure 2:
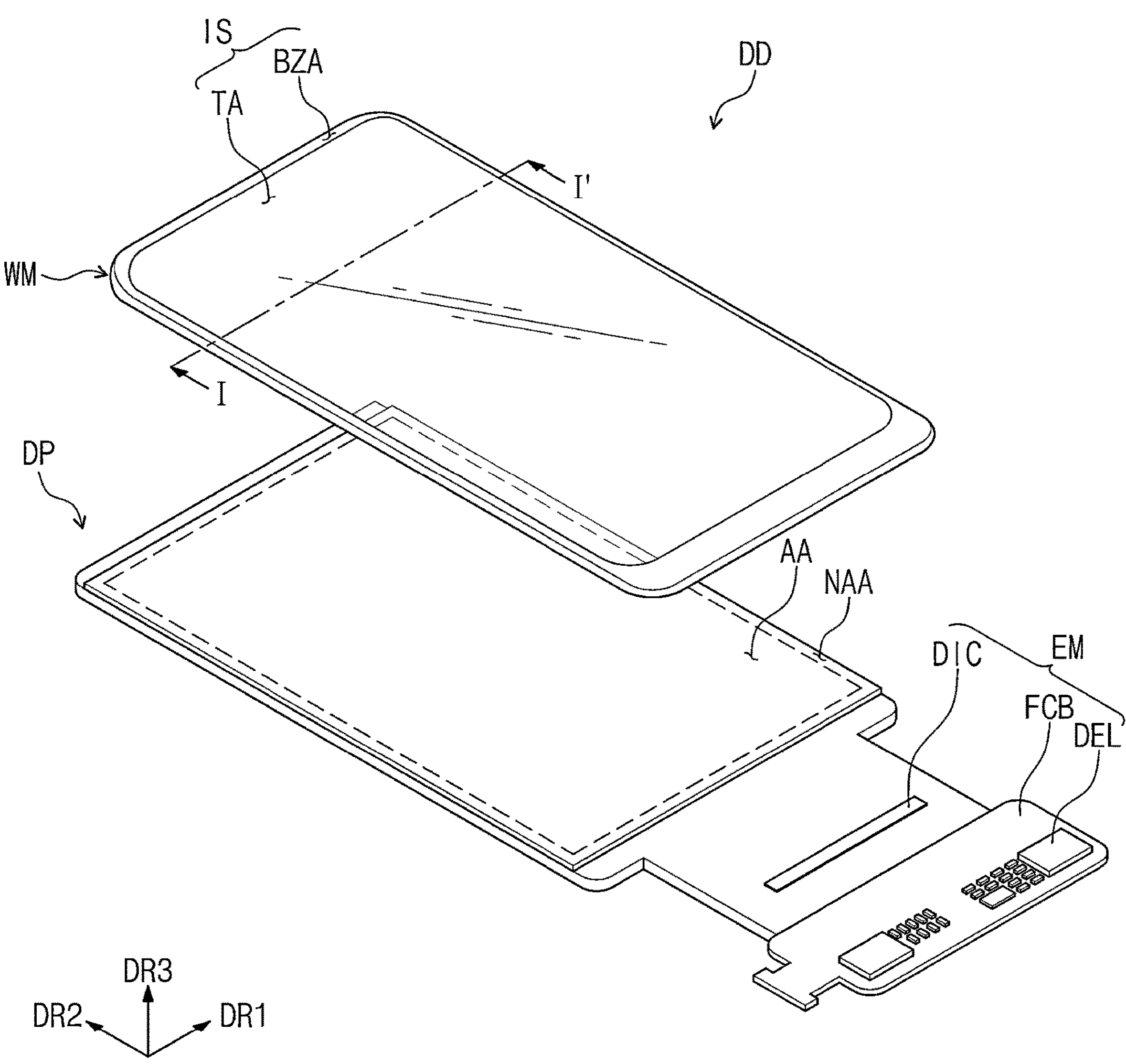
FIG. 2 is an exploded perspective view of a display device according to an embodiment of the invention.

FIG. 1 is a perspective view of a display device according to an embodiment, and FIG. 2 is an exploded perspective view of a display device according to an embodiment.

In an embodiment and referring to FIGS. 1 and 2, a display device DD may be activated in response to electrical signals. The display device DD may include various embodiments. For example, the display device DD may be an electronic device such as a smart watch, a tablet computer, a laptop computer, a computer, and/or a smart television.

In an embodiment, the display device DD may display an image IM on a display surface IS, parallel to a first direction DR1 and a second direction DR2, and directed toward a third direction DR3. The display surface IS on which the image IM is displayed may correspond to a front surface of the display device DD. The image IM may include a still image as well as a dynamic image.

In an embodiment, a front surface (or upper surface) and a rear surface (or lower surface) of each of the members are defined based on the third direction DR3 in which the image IM is displayed. The front surface and the rear surface may oppose each other in the third direction DR3, and the normal direction of each of the front surface and the rear surface may be parallel to the third direction DR3.

In an embodiment, a distance between the front surface and the rear surface in the third direction DR3 may correspond to the thickness of an electronic device in the third direction DR3. Meanwhile, directions indicated by the first to third directions DR1, DR2, and DR3, respectively, may be relative concepts, and may be changed to other directions.

Meanwhile, the display device DD according to an embodiment may detect a user's input applied from the outside. The user's input may include various types of external inputs such as a part of a user's body, light, heat, and/or pressure. In addition, the display device DD may detect inputs in contact with the display device DD, and may also detect inputs approaching and/or adjacent thereto.

Moreover, In an embodiment, the display device DD may also detect a user's input applied to a side surface and/or a rear surface of the display device DD depending on the structure of the display device DD, and is not limited to any one embodiment.

In an embodiment, the front surface of the display device DD may be divided into a transmission region TA and a bezel region BZA. The transmission region TA may be a region in which the image IM is displayed. A user views the image IM through the transmission region TA. In this embodiment, it is illustrated that the transmission region TA has a quadrilateral shape with rounded corners. However, this is exemplarily illustrated, and the transmission region TA may have various shapes, and is not limited to any one embodiment.

In an embodiment, the bezel region BZA is disposed adjacent to the transmission region TA. The bezel region BZA may have a predetermined color. The bezel region BZA may surround the transmission region TA. Accordingly, the shape of the transmission region TA may be substantially defined by the bezel region BZA. However, this is exemplarily illustrated, and the bezel region BZA may be disposed adjacent only to one side of the transmission region TA, or may also be omitted. The display device DD according to an embodiment may include various embodiments, and is not limited to any one embodiment.

In an embodiment, the display device DD may include a window WM, a display module, and/or a driving module EM.

In an embodiment, the window WM may be made of a transparent material capable of outputting images. For example, the material may include glass, sapphire, plastic, and/or the like. Although it is illustrated that the window WM is a single layer, an embodiment is not limited thereto, and the window WM may include multiple layers. Meanwhile, although not illustrated in the drawing, the bezel region BZA of the display device DD may be provided substantially as a region of the window WM in which a material having a predetermined color is printed. The window WM in FIG. 2 may correspond to a window coating layer WM in FIG. 3.

In an embodiment, the display module may include a display panel DP and/or an input-sensing layer. The display panel DP according to an embodiment may be an emission-type display panel, but is not limited particularly thereto. For example, the display panel DP may be an organic light-emitting display panel, an inorganic light-emitting display panel, and/or a quantum-dot light-emitting display panel. A light-emitting layer of the organic light-emitting display panel may include an organic light-emitting material, and a light-emitting layer of the inorganic light-emitting display panel may include an inorganic light-emitting material. A light-emitting layer of the quantum-dot light-emitting display panel may include quantum dots, quantum rods, and/or the like. Hereinafter, the display panel DP will be described as an organic light-emitting display panel.

In an embodiment, the input-sensing layer may be directly disposed on the display panel DP. According to an embodiment, the input-sensing layer may be formed on the display panel DP through a continuous process.

In an embodiment, the display panel DP may generate the image IM, and/or the input-sensing layer ISP may acquire coordinate information on an external input (for example, a touch event).

However, in an embodiment, although not illustrated in the drawing, the display device DD may further include an additional layer, for example, an optical layer and/or functional layers, disposed between the display panel DP and the window WM.

In an embodiment, the display module may display the image IM and detect an external input. That is, the display module may display the image in response to electrical signals, and/or may transmit/receive information on the external input. The display module may be defined as an active region AA and a peripheral region NAA. In this embodiment, the active region AA may be a region in which the image IM is displayed, and at the same time, a region in which an external input is detected. However, this is exemplarily illustrated. In the active region AA, the region in which the image IM is displayed and the region in which an external input is detected may be separated from each other, and an embodiment is not limited to thereto.

In an embodiment, the peripheral region NAA is disposed adjacent to the active region AA. For example, the peripheral region NAA may surround the active region AA. However, this is exemplarily illustrated, and the peripheral region NAA may be defined in various shapes, and is not limited to any one embodiment. In an embodiment, the active region AA of the display module may correspond to at least a portion of the transmission region TA.

In an embodiment, various signal lines and/or pads, which provide electrical signals to the active region AA, electronic devices, etc., may be disposed in the peripheral region NAA. The peripheral region NAA may be covered by the bezel region BZA, and may thus be invisible from the outside.

In an embodiment, the driving module EM may control operation of the display module. The driving module EM may include a flexible circuit film FCB and a driving chip DIC. The flexible circuit film FCB may be electrically connected to the display panel DP. The flexible circuit film FCB may be bonded to the end of the display panel DP through a bonding process. The flexible circuit film FCB may be electrically connected to the display module through an anisotropic conductive adhesive layer. The driving chip DIC may be mounted on the display module. The driving chip DIC may include driving circuits, for example a data driving circuit, for driving pixels of the display panel DP.

In an embodiment, the driving module EM may further include a plurality of driving elements DEL mounted on the flexible circuit film FCB. The plurality of driving elements DEL may include a circuit unit for converting signal inputs from the outside to signals required for the driving chip DIC, and/or to signals required for driving the display module.

Figure 3:
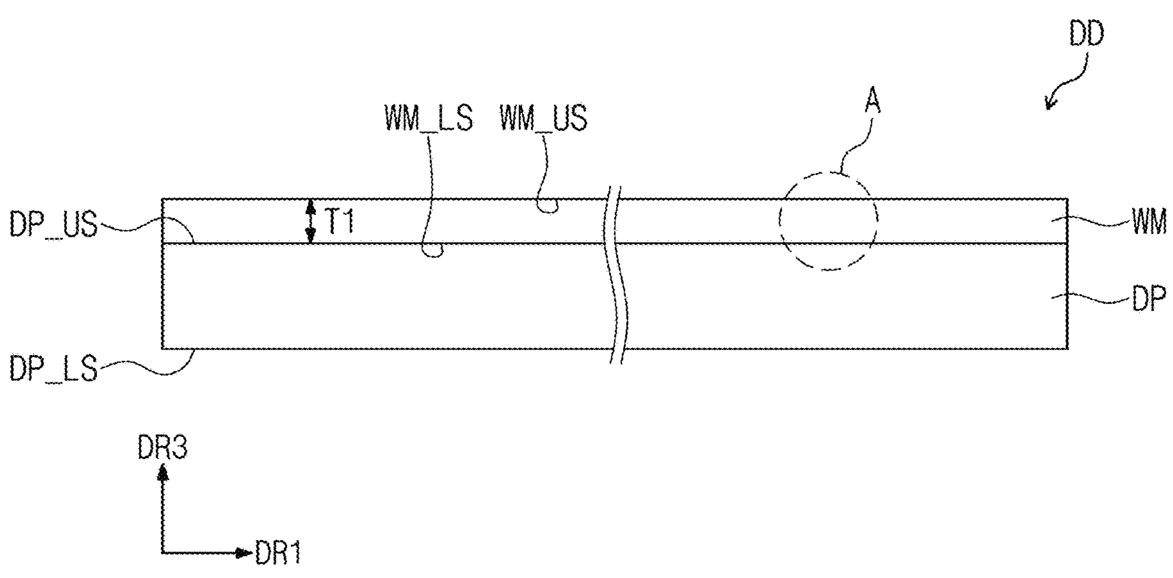
FIG. 3 is a cross-sectional view of a display device according to an embodiment of the invention.

FIG. 3 is a cross-sectional view of a display device according to an embodiment.

Referring to FIG. 3, a display device DD according to an embodiment includes a display panel DP and a window coating layer WM. The window coating layer WM corresponds to the aforementioned window WM (see FIG. 2).

In an embodiment, the window coating layer WM is directly disposed on an upper surface DP_US of the display panel DP. That is, the window coating layer WM is disposed on the display panel DP without intervention of an adhesive member or adhesive layer. For example, the window coating layer WM may be a print layer of the upper surface DP_US of the display panel DP.

In an embodiment, by disposing the window coating layer WM directly on the upper surface DP_US of the display panel DP without adhesive members, the process may be simplified, and thus it may be possible to reduce the manufacturing cost of the display device DD.

According to an embodiment, the thickness of the window coating layer WM may be about 50 μm to about 1 mm. When the window coating layer WM, which protects the display panel DP, has a thickness T1 of about 50 μm or less, the window coating layer WM may not have sufficient durability such as hardness, impact resistance, or scratch resistance. The window coating layer WM is required to have at least a predetermined thickness in order to serve as a protective layer, but the thickness T1 of the window coating layer WM exceeding about 1 mm makes it difficult to achieve a small radius of curvature to be desired in bending of the display device DD. In addition, when the thickness T1 of the window coating layer WM is greater than about 1 mm, materials for the window coating layer WM are consumed a lot, thereby increasing the manufacturing cost of the display device DD, and making it difficult to achieve process efficiency.

In particular, in an embodiment, the thickness T1 of the window coating layer WM may be about 480 μm to about 630 μm. Desirably, the thickness T1 of the window coating layer WM may be about 523 μm. When the thickness T1 of the window coating layer WM is about 480 μm or more, a certain level of durability, such as hardness, impact resistance, and scratch resistance, may be secured without intervention of an adhesive member, adhesive layer, and/or the like. In addition, when the thickness T1 of the window coating layer WM is about 630 μm or less, the manufacturing cost in a process of printing the window coating layer WM may be reduced, and process efficiency may be ensured.

Figure 4:
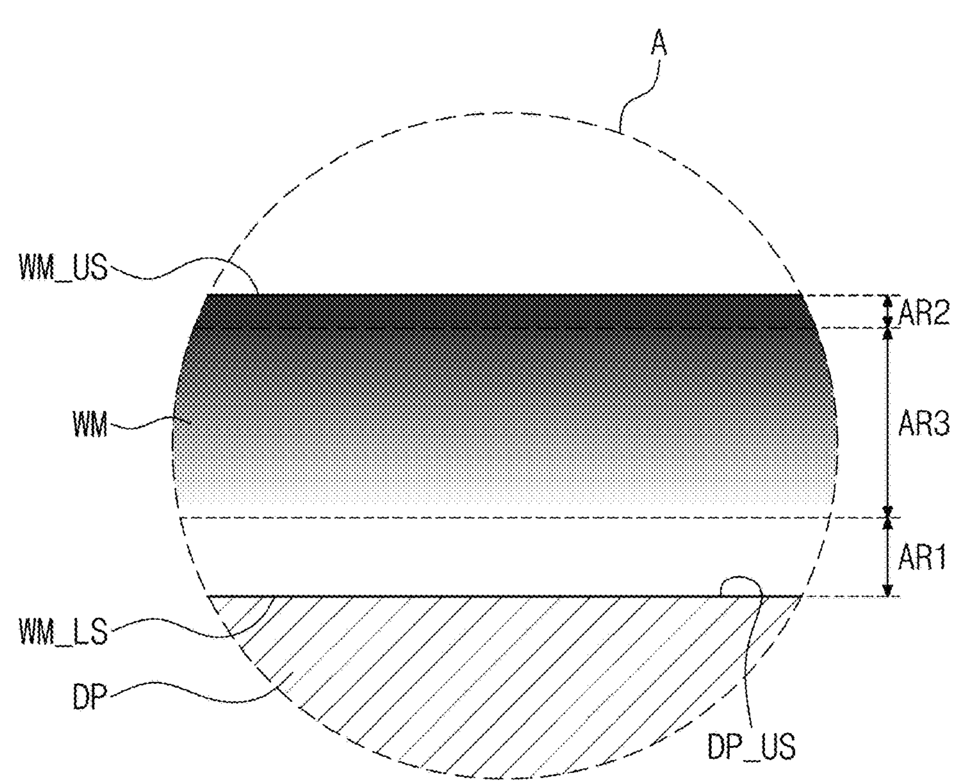
FIG. 4 is an enlarged cross-sectional view of portion A of FIG. 3, according to an embodiment of the invention.

In an embodiment, FIG. 4 is an enlarged cross-sectional view of portion A of FIG. 3.

In an embodiment and referring to FIG. 4, the window coating layer WM may include a first region AR1, a second region AR2, and a third region AR3.

In an embodiment, the first region AR1 may include a lower surface WM_LS of the window coating layer WM, and expand in the thickness direction of the window coating layer WM. The second region AR2 may include an upper surface WM_US of the window coating layer WM, and expand in the thickness direction of the window coating layer WM.

In an embodiment, the third region AR3 may be positioned between the first region AR1 and the second region AR2. The third region AR3 is illustrated in the drawing, but the third region AR3 may be omitted in some cases, and is not limited to any one embodiment.

According to an embodiment, the first region AR1 may have an elastic modulus of about 1 Mpa to about 100 Mpa, and the second region AR2 may have an elastic modulus of about 1 Gpa to about 10 Gpa. The second region AR2 may have an elastic modulus of about 1 Gpa to about 5 Gpa. The third region AR3 may have an elastic modulus between those of the first region AR1 and the second region AR2.

In an embodiment, the elastic modulus of the first region AR1 may increase toward the second region AR2. In other words, the elastic modulus of the first region AR1 may increase toward the upper surface WM_US of the window coating layer WM, and increase away from the upper surface DP_US of the display panel DP.

In an embodiment, the elastic modulus of the second region AR2 may increase away from the first region AR1. In other words, the elastic modulus of the second region AR2 may increase toward the upper surface WM_US of the window coating layer WM, and increase away from the upper surface DP_US of the display panel DP.

In an embodiment, the third region AR3 is illustrated in the drawing, but the third region AR3 may be omitted in some cases, and is not limited to any one embodiment.

In an embodiment, the elastic modulus of the first region AR1 may be about 1 Mpa or more. When the elastic modulus of the first region AR1 is less than about 1 Mpa, the first region AR1 may be softer than necessary, and thus disadvantageous in terms of durability. For example, the elastic modulus of the first region AR1 may be about 1 Mpa to about 100 Mpa. By preventing the elastic modulus of the first region AR1 from exceeding about 100 Mpa, it may be possible to prevent detachment, of the upper surface DP_US of the display panel DP and the lower surface WM_LS of the window coating layer WM, caused by the difference in elastic modulus during bending of the display device DD.

In an embodiment, the elastic modulus of the second region AR2 may be about 1 Gpa or more. When the elastic modulus of the second region AR2 is less than about 1 Gpa, an upper part of the window coating layer WM does not have sufficient durability, and for example, the upper surface WM_US of the window coating layer WM has poor impact resistance. For example, the elastic modulus of the second region AR2 may be about 1 Gpa to about 10 Gpa. Alternatively, the elastic modulus of the second region AR2 may be about 1 Gpa to about 5 Gpa.

In an embodiment, the window coating layer WM may include a resin. In an embodiment, the window coating layer WM may be formed by curing the resin. For example, the resin may be a thermosetting material. For example, the resin may be a polyurethane-based resin, a urethane acrylate-based resin, a polyurea-based resin, an epoxy-based resin, a silicon-based resin, and/or the like.

In an embodiment, the curing rates of the lower surface WM_LS and the upper surface WM_US of the window coating layer WM may differ from each other. This will be described later in detail with reference to FIG. 5.

According to an embodiment, the window coating layer WM may be a single layer. The window coating layer WM may be a single layer formed by curing a single-layer resin. The window coating layer WM may include a region having an elastic modulus gradient in a single-layer structure.

However, an embodiment is not limited thereto, and the window coating layer WM may include multiple layers. In an embodiment, resins constituting respective layers may include the same material or different materials, and even when the resins are same, a resin having a different curing rate (and/or a layer made of a resin) may be obtained by changing the curing conditions.

In an embodiment, the window coating layer WM may be formed on the upper surface DP_US of the display panel DP through coating or printing. For example, the window coating layer WM may be formed on the upper surface DP_US of the display panel DP, without adhesive members, through a roll coating, silk-screen coating, spray coating, slit coating, and/or the like. However, the method of coating the window coating layer WM on the upper surface DP_US of the display panel DP is not limited to the above-mentioned methods, and the window coating layer WM may be directly coated on the upper surface DP_US of the display panel DP through various coating methods.

Figure 5:
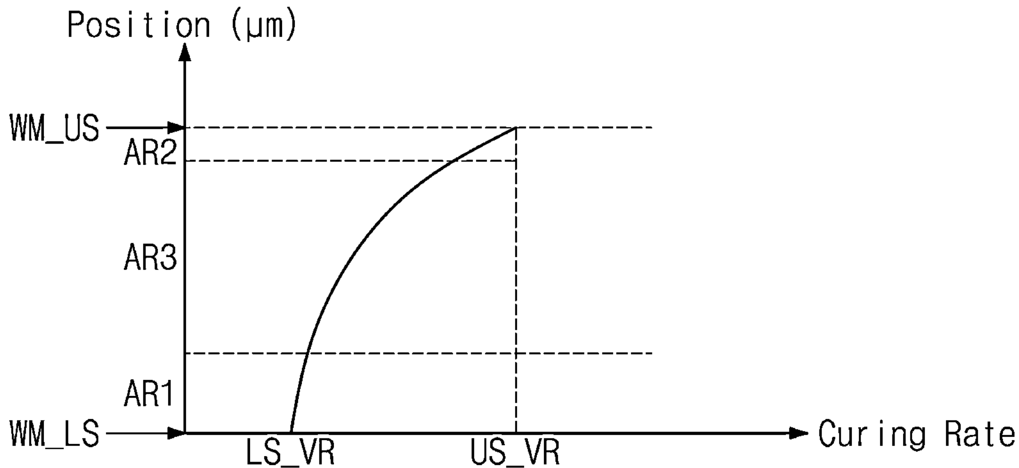
FIG. 5 is a graph showing a curing rate versus a position in a window coating layer according to an embodiment of the invention.

FIG. 5 is a graph showing a curing rate versus a position in a window coating layer according to an embodiment.

In an embodiment and referring to FIG. 5, the curing rate of the window coating layer WM (see FIG. 4) may change along the thickness direction of the window coating layer WM (see FIG. 4). For example, when a resin applied onto the display panel DP (see FIG. 4) is cured, the curing rate of the window coating layer WM (see FIG. 4) may be increased along the thickness direction by controlling energy transferred to the resin. This will be described later in detail.

In an embodiment, the lower surface WM_LS of the window coating layer WM (see FIG. 4) may have a lower-surface curing rate LS_VR, and the upper surface WM_US of the window coating layer WM (see FIG. 4) may have an upper-surface curing rate US_VR. According to an embodiment, the lower-surface curing rate LS_VR may be about 10% to about 50%, and the upper-surface curing rate US_VR may be about 98% or less.

In an embodiment, the curing rate of the window coating layer WM (see FIG. 4) may increase along the thickness direction. In other words, the curing rate of the window coating layer WM (see FIG. 4) may increase from the lower surface WM_LS toward the upper surface WM_US. In particular, the curing rate in a first region AR1 may be less than the curing rate in a second region AR2, and the curing rate in the second region AR2 may be greater than the curing rate in a third region AR3.

In an embodiment, by making the curing rate in the first region AR1 less than the curing rate in the third region AR3, the materials of the window coating layer WM (see FIG. 4) in the first region AR1 may have more fluid characteristics than the materials in the third region AR3. Since the materials in the first region AR1 have more fluidity than the materials in the third region AR3, it may be possible to relieve external impact applied to the display panel DP (see FIG. 4) and members thereunder. That is, the impact resistance may be further improved.

For example, in an embodiment, the lower-surface curing rate LS_VR may be about 50%, and the upper-surface curing rate US_VR may be about 90%. In this case, the window coating layer WM (see FIG. 4) may have improved impact resistance.

In an embodiment and referring to FIG. 5, the position-curing rate change graph is shown as a curve for the convenience, but the type of graph is not limited thereto. The position-curing rate change graph may be shown as a straight line, or as other types of curves.

Figure 6A:
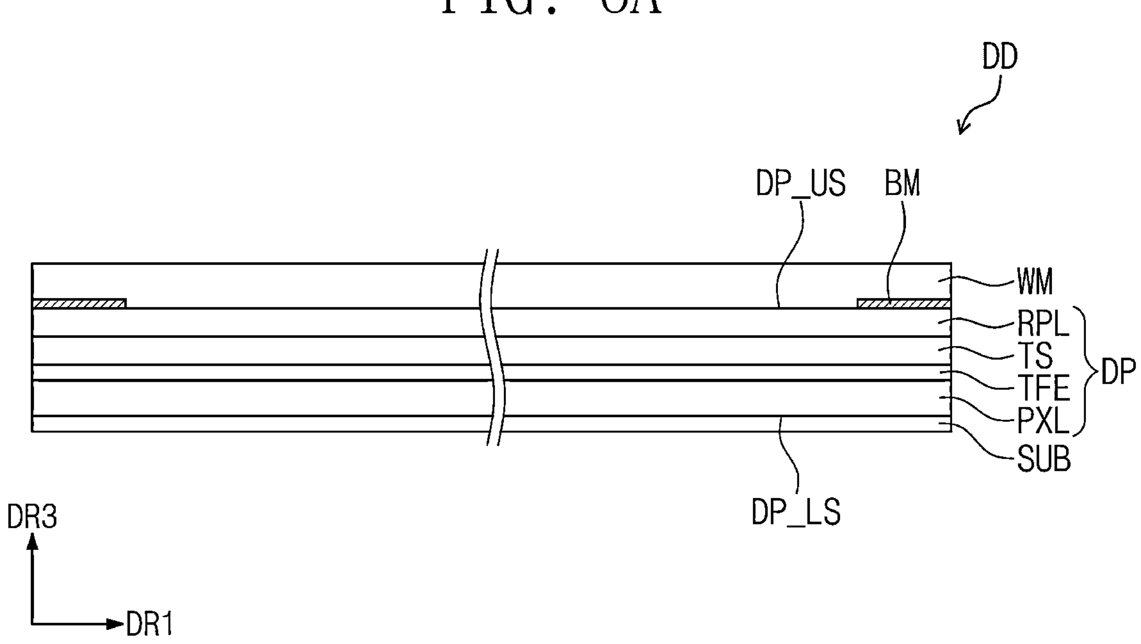
FIG. 6A is a cross-sectional view of a display device according to an embodiment of the invention.
Figure 6B:
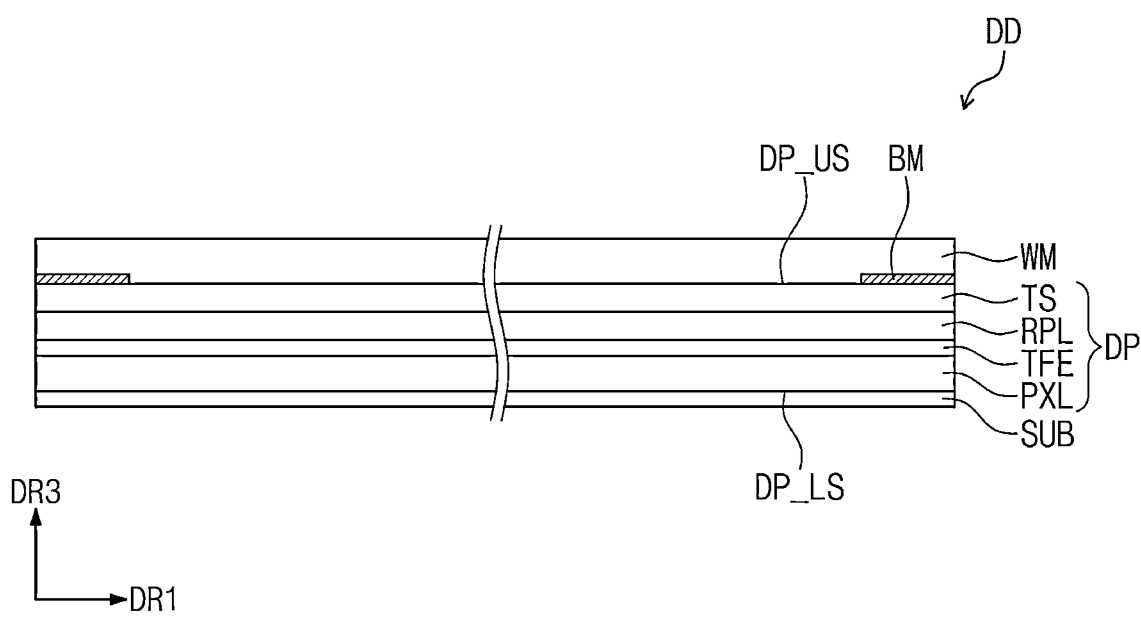
FIG. 6B is a cross-sectional view of a display device according to an embodiment of the invention.

FIGS. 6A and 6B are cross-sectional views of a display device according to an embodiment.

In an embodiment and referring to FIG. 6A, a display panel DP may include a base layer SUB, a pixel layer PXL, an input-sensing layer TS, and an anti-reflection layer RPL. However, an embodiment is not limited thereto, and the display panel DP may further include a typical component known in the art, for example, an encapsulation layer TFE.

In an embodiment, the base layer SUB, the pixel layer PXL, the input-sensing layer TS, the anti-reflection layer RPL, and/or the encapsulation layer TFE may be integrally formed through a continuous process, but the forming method is not limited thereto. The input-sensing layer TS, the anti-reflection layer RPL, the encapsulation layer TFE, and/or the like may be disposed on an upper surface of the pixel layer PXL without an adhesive member, and in this case, the process is simplified, thereby reducing the manufacturing cost of the display device DD.

In an embodiment, the base layer SUB may be a substrate on which the pixel layer PXL, the input-sensing layer TS, the anti-reflection layer RPL, the encapsulation layer TFE, and/or the like are to be disposed. The base layer SUB may prevent external moisture from penetrating the pixel layer PXL, and may absorb external impact. The base layer SUB may be a flexible substrate. The base layer SUB may include any one selected from the group consisting of polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), poly (arylene ether sulfone), and/or a combination thereof.

In an embodiment, the material constituting the base layer SUB is not limited to the plastic resins, and the base layer SUB may include a glass substrate, a metal substrate, an organic/inorganic composite material substrate, and/or the like.

In an embodiment, the pixel layer PXL is disposed on the base layer SUB. The pixel layer PXL may display an image in response to the input image data (not shown).

In an embodiment, the pixel layer PXL may be an organic light-emitting display panel, an electrophoresis display panel, and/or an electrowetting display panel, and the type thereof is not limited. Herein, an organic light-emitting display panel is exemplarily described, and the organic light-emitting display panel will be described later in detail.

In an embodiment, the encapsulation layer TFE may be disposed on the upper side of the pixel layer PXL. The encapsulation layer TFE may be disposed to seal the pixel layer PXL. The encapsulation layer TFE may serve to protect the pixel layer PXL, which may easily deteriorate due to external moisture or oxygen. The encapsulation layer TFE may include an organic material, and furthermore, the encapsulation layer TFE may have a stacked structure of an organic layer and an inorganic layer.

In an embodiment, the input-sensing layer TS and the anti-reflection layer RPL may be disposed on the encapsulation layer TFE, and the stacking order is not particularly limited. For example, the anti-reflection layer RPL may be disposed between the encapsulation layer TFE and the input-sensing layer TS, and the input-sensing layer TS may be disposed between the encapsulation layer TFE and the anti-reflection layer RPL.

In an embodiment, the input-sensing layer TS may acquire coordinate information on an external input. The external input may be a direct touch, and/or an indirect touch. The input-sensing layer TS may be disposed on an upper surface of the encapsulation layer TFE. The input-sensing layer TS may be formed through a continuous process, together with the pixel layer PXL and the encapsulation layer TFE. The input-sensing layer TS may be directly disposed on the upper surface of the encapsulation layer TFE. However, an embodiment is not limited thereto, and an adhesive member and/or the like may be disposed between the input-sensing layer TS and the encapsulation layer TFE.

In an embodiment, the anti-reflection layer RPL may be disposed on an upper surface of the input-sensing layer TS. The anti-reflection layer RPL may be disposed on the outermost layer of the display panel.

In an embodiment, the anti-reflection layer RPL may be a layer capable of reducing the reflectance of light incident from the outside. For example, the anti-reflection layer RPL may reduce the reflectance by including a polarizer and/or a phase retardation film to polarize the incident light, reduce the reflectance by destructively interfering with the light incident, and/or reduce the reflectance by including a plurality of color filter layers and/or a light-absorbing member (for example, a black matrix) to absorb the incident light.

According to an embodiment, the anti-reflection layer RPL may be formed through a continuous process, together with the input-sensing layer TS. According to an embodiment, the anti-reflection layer RPL may constitute a portion of the input-sensing layer TS.

In an embodiment, the black matrix BM may overlap the peripheral region NAA (see FIG. 2), and may be disposed on an upper surface DP_US of the display panel DP. The black matrix BM may include various materials capable of absorbing light. In general, the black matrix BM may include a black organic material mixed with a black pigment, chrome oxide CrOx, and/or the like. The black matrix BM may be disposed to overlap the peripheral region NAA (see FIG. 2), and thus wires used for driving the display device DD may be invisible to the outside, and/or the black matrix BM may lower external light reflection by absorbing the external light. For example, the black matrix BM may overlap the entire peripheral region NAA (see FIG. 2) on a plane.

In an embodiment, the window coating layer WM may be directly disposed on an outer surface of the anti-reflection layer RPL and an outer surface of the black matrix BM, that is, on an upper surface of the anti-reflection layer RPL and an upper surface of the black matrix BM. In this case, the upper surface DP_US of the display panel DP may be the upper surface of the anti-reflection layer RPL and the upper surface of the black matrix BM. The window coating layer WM, as previously described, may be directly disposed on the upper surface of the anti-reflection layer RPL and the upper surface of the black matrix BM without adhesive members such as an optical clear adhesive (OCA), an optical clear resin (OCR), and/or a pressure sensitive adhesive (PSA).

In an embodiment and referring to FIG. 6B, the anti-reflection layer RPL of the display panel DP may be disposed on the upper surface of the encapsulation layer TFE, and the input-sensing layer TS may be disposed on the upper surface of the anti-reflection layer RPL. That is, the input-sensing layer TS may be the outermost layer of the display panel DP, and in this case, the upper surface DP_US of the display panel DP may be an outer surface of the input-sensing layer TS, that is, the upper surface of the input-sensing layer TS, and the window coating layer WM may be directly disposed on the upper surface of the input-sensing layer TS.

In the above, various stacked structures of layers included in the display panel DP have been exemplarily described, but an embodiment is not limited thereto. The layers included in the display panel DP may be stacked in various orders.

Figure 7A:
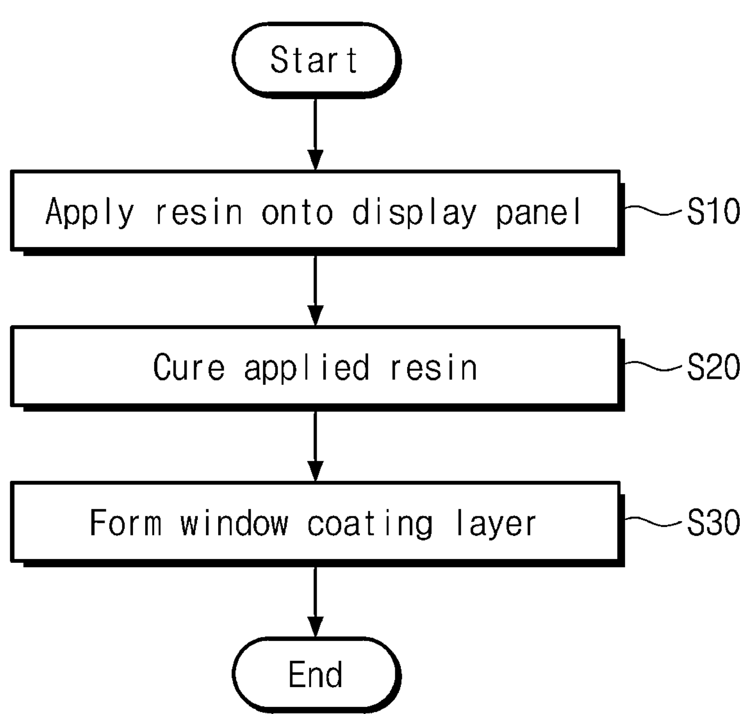
FIG. 7A is a flowchart showing a method of manufacturing a display device according to an embodiment of the invention.
Figure 7B:
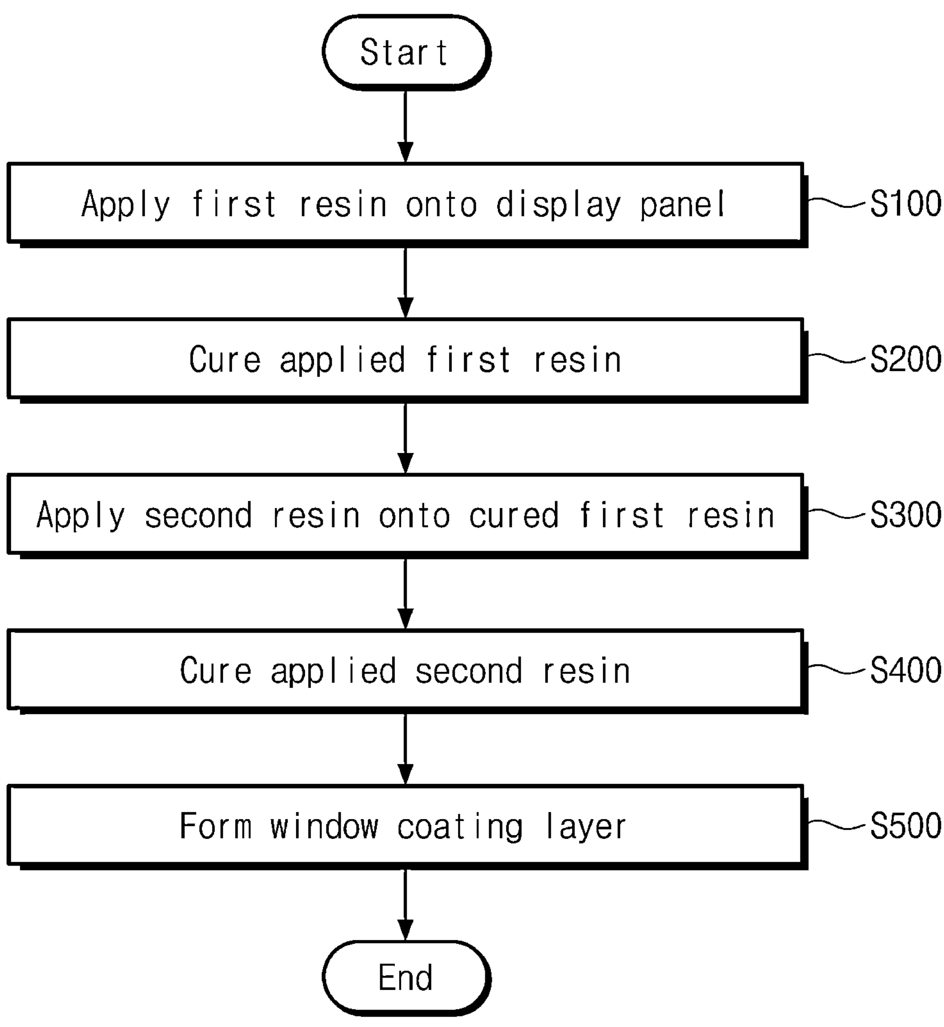
FIG. 7B is a flowchart showing a method of manufacturing a display device according to an embodiment of the invention.

FIGS. 7A and 7B are flowcharts showing a method of manufacturing a display device according to an embodiment.

Referring to FIG. 7A, the method of manufacturing a display device according to an embodiment may include applying a resin onto a display panel (S10), curing the applied resin (S20), and forming a window coating layer (S30).

In an embodiment, a display panel and a window coating layer to be described below may be respectively the display panel DP (see FIG. 6A) and the window coating layer WM (see FIG. 6A) that have been described above.

In an embodiment, processing the cured resin may be additionally performed between the curing of the applied resin RS (see FIG. 8B) (S20) and the forming of a window coating layer WM (see FIG. 8C) (S30), but an embodiment is not limited thereto. The processing of the cured resin may be omitted but the invention is not limited to any one embodiment.

In an embodiment, in the curing of the applied resin RS (see FIG. 8B) (S20), the resin may be cured through heat curing and/or UV curing. The curing method may be selected and used depending on a material constituting the resin, etc., and selected and used as needed in manufacturing processes, and is not limited to any one method.

Hereinafter, in an embodiment, for the convenience of description, the curing of the applied resin RS (see FIG. 8B) (S20) will be described as the UV curing among the curing methods. However, an embodiment is not limited to the following description, and the applied resin may also be cured through the heat curing.

Figure 8A:
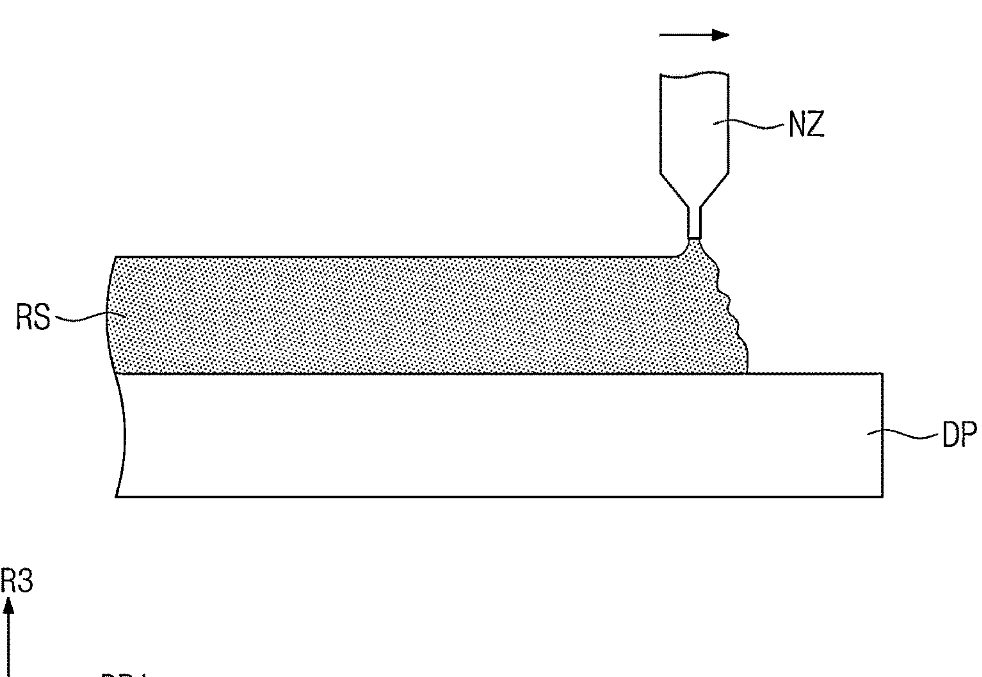
FIG. 8A is a graphic illustrating an operation of a method of manufacturing a display device according to an embodiment of the invention.
Figure 8B:
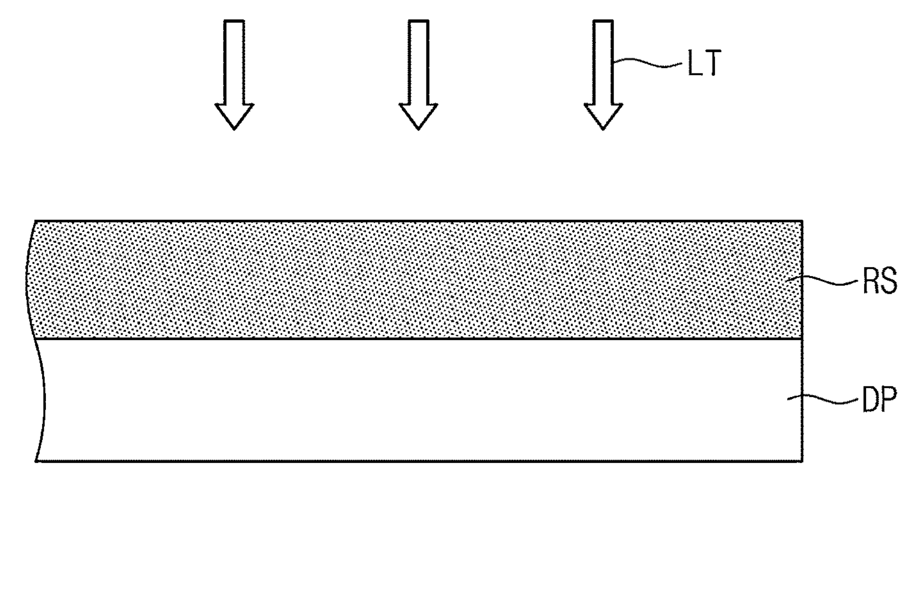
FIG. 8B is a graphic illustrating an operation of a method of manufacturing a display device according to an embodiment of the invention.

In an embodiment, in the curing of the applied resin RS (see FIG. 8B) (S20), the curing rate of the resin may be adjusted by controlling energy transferred to the applied resin RS (see FIG. 8B). By controlling energy transferred to the resin, it may be possible to form the window coating layer WM (see FIG. 8C) which has the lower-surface curing rate and the upper-surface curing rate, as previously described with reference to FIG. 5, and also possible to form the window coating layer WM (see FIG. 8C) where the curing rate of which increases in the thickness direction.

In an embodiment, the energy transferred to the applied resin RS (see FIG. 8B) may change depending on at least one of an intensity of a UV beam applied to the applied resin, a velocity of the UV beam, a UV beam application cycle, and/or a curing time for the applied resin RS (see FIG. 8B). By controlling the energy transferred to the applied resin RS (see FIG. 8B), a window coating layer having a desired position-curing rate distribution graph may be formed as needed, and thus it may be possible to ensure increased impact resistance of the window coating layer WM (see FIG. 8C), degree of freedom in design of a display device, an ultra-small display device, etc.

In an embodiment, the energy transferred to the applied resin RS (see FIG. 8B) may be increased by controlling an intensity of a UV beam, a velocity of the UV beam, and/or a UV beam application cycle. For example, the energy transferred to the applied resin RS (see FIG. 8B) may be increased by increasing the intensity of the UV beam, and/or the UV beam application cycle.

For example, in an embodiment, when the intensity of the UV beam applied to the applied resin RS (see FIG. 8B) is about 58 mW/cm2, the velocity of the UV beam is about 1 m/min, and the UV beam application cycle is twice, the energy transferred to the applied resin may be about 606 mJ/cm2. However, an embodiment is not limited thereto, and the intensity of the UV beam applied to the applied resin, the velocity of the UV beam, and/or the UV beam application cycle may vary.

In an embodiment, even when the same energy is transferred to the applied resin RS (see FIG. 8B), the position-curing rate change graph of the window coating layer WM (see FIG. 8C) may vary depending on a stacked structure of the display panel DP (see FIG. 8B) positioned under the applied resin RS (see FIG. 8B), and/or the constituting material thereof. This is due to each of the components constituting the display panel DP (see FIG. 8B), and display panels having different stacked structures respectively have different transmittances and reflectances. By controlling an intensity of a UV beam, a velocity of the UV beam, and/or a UV beam application cycle, in consideration of the transmittance and the reflectance due to the stacked structure of the display panel DP (see FIG. 8B) and/or the constituting material thereof, the window coating layer WM (see FIG. 8C) having a desired position-curing rate change graph may be formed.

According to an embodiment, the applying of the resin onto the display panel (S10) may include applying a first resin onto the display panel and applying a second resin onto the first resin. In addition, the curing of the applied resin may include curing the first resin after the first resin is applied and before the second resin is applied, and curing the second resin after the second resin is applied.

Referring to FIG. 7B, the method of manufacturing a display device according to an embodiment may include applying a first resin onto a display panel (S100), curing the applied first resin (S200), applying a second resin onto a cured first resin (S300), curing the applied second resin (S400), and forming a window coating layer (S500).

According to an embodiment, the first resin RS1 (see FIG. 9B) and the second resin RS2 (see FIG. 9D) may be constructed of different materials. However, an embodiment is not limited thereto, and the first and second resins RS1 and RS2 may be constructed from the same material.

In addition, in an embodiment, the first resin RS1 (see FIG. 9B) and the second resin RS2 (see FIG. 9D) may be cured under different curing conditions. In other words, energy transferred to the first resin RS1 (see FIG. 9B) may be different from energy transferred to the second resin RS2 (see FIG. 9D). Accordingly, the position-curing rate distribution graph of the cured first resin WM1 (see FIG. 9E) may be different from the position-curing rate distribution graph of the cured second resin WM2 (see FIG. 9E).

Figure 8C:
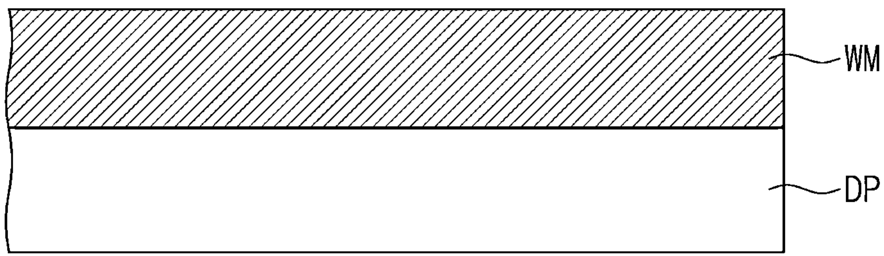
FIG. 8C is a graphic illustrating an operation of a method of manufacturing a display device according to an embodiment of the invention.
Figure 8C:
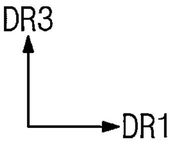

FIGS. 8A through 8C are cross-sectional views respectively illustrating operations of a method of manufacturing a display device according to an embodiment. In the following, FIGS. 8A and 8B respectively illustrate operations of the aforementioned method of manufacturing a display device according to the embodiment of FIG. 7A.

In an embodiment, FIG. 8A illustrates the applying of a resin RS onto a display panel DP.

According to an embodiment, the resin RS may be provided on the display panel DP. In other words, the resin RS may be applied onto the display panel DP. The resin RS may be provided through inkjet printing, dispensing, and/or slot-die coating. For example, the resin RS may be provided through a nozzle NZ. However, this is an example, and the tool for providing the resin RS is not limited to the nozzle NZ.

In an embodiment, FIG. 8B illustrates the curing of the applied resin RS, and FIG. 8C illustrates a state in which the window coating layer WM is formed on the display panel DP. The curing of the applied resin RS may be the forming of a window coating layer WM.

In an embodiment, in the curing of the applied resin RS, heat and/or a UV beam LT may be provided. In the curing of the applied resin RS, energy transferred to the applied resin RS may be controlled, as previously described, so that the window coating layer WM, which has a lower-surface curing rate of about 10% to about 50% and an upper-surface curing rate of about 98%, and the curing rate of which increases along the thickness direction, may be formed as previously described with reference to FIG. 5.

FIGS. 9A through 9E are cross-sectional views respectively illustrating operations of a method of manufacturing a display device according to an embodiment. In the following, FIGS. 9A through 9E respectively illustrate operations of the aforementioned method of manufacturing a display device according to the embodiment of FIG. 7B.

Figure 9A:
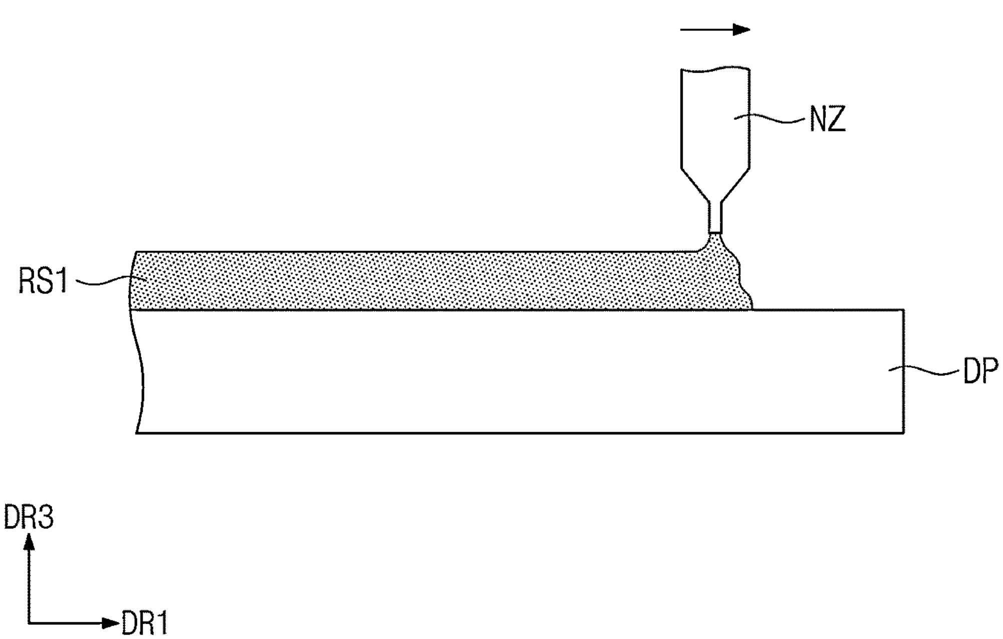
FIG. 9A is a graphic illustrating an operation of a method of manufacturing a display device according to an embodiment of the invention.

In an embodiment, FIG. 9A illustrates the applying of a first resin RS1 onto a display panel PD.

According to an embodiment, the first resin RS1 may be provided on the display panel DP. As previously described, the first resin RS1 may be provided on the display panel DP through various methods.

Figure 9B:
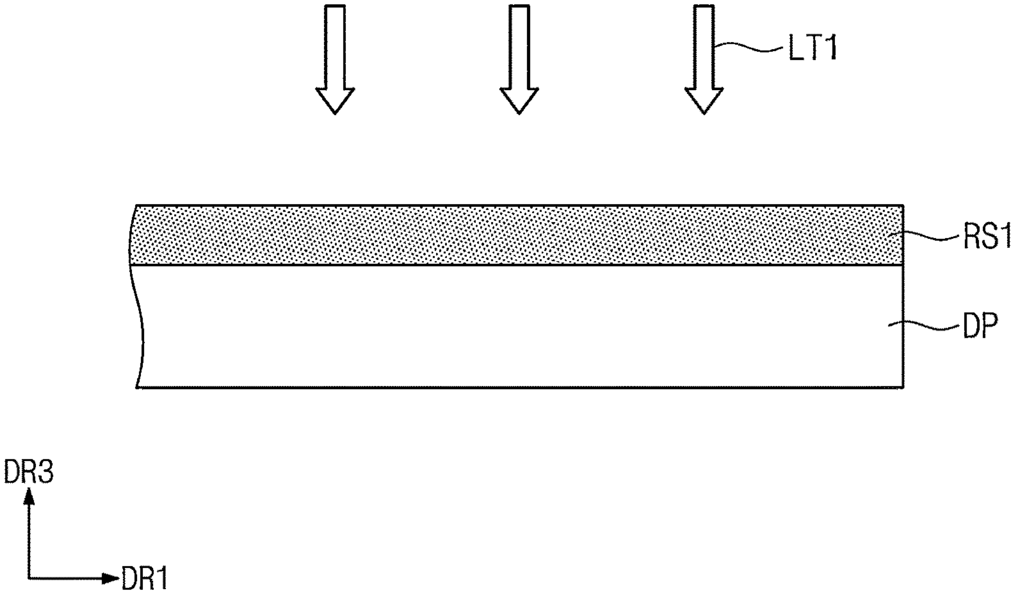
FIG. 9B is a graphic illustrating an operation of a method of manufacturing a display device according to an embodiment of the invention.

In an embodiment, FIG. 9B illustrates the curing of the first resin RS1. In the curing of the applied first resin RS1, a first UV beam LT1 may be provided. Energy transferred to the first resin RS1 through the first UV beam LT1 may be controlled, so that the first resin RS1 has a predetermined position-curing rate distribution graph.

Figure 9C:
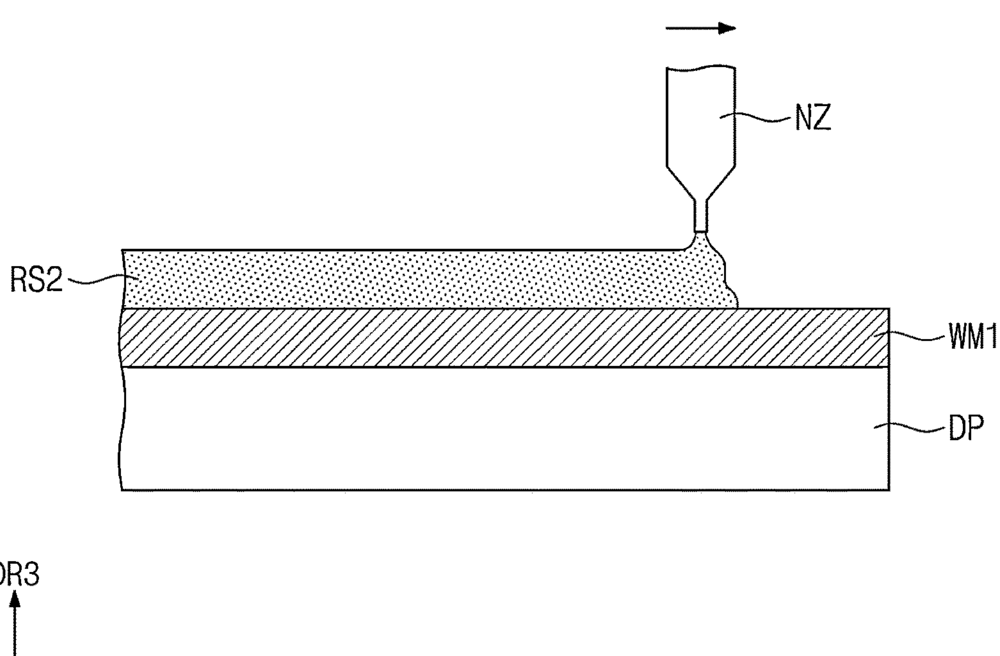
FIG. 9C is a graphic illustrating an operation of a method of manufacturing a display device according to an embodiment of the invention.

In an embodiment, FIG. 9C illustrates the applying of a second resin RS2 onto a cured first resin WM1. The second resin RS2 may be applied onto the cured first resin WM1 through various methods, and may be applied through the same method as the first resin RS1 (see FIG. 9A).

In an embodiment, the thickness of the applied first resin RS1 (see FIG. 9B) may be different from the thickness of the applied second resin RS2.

Figure 9D:
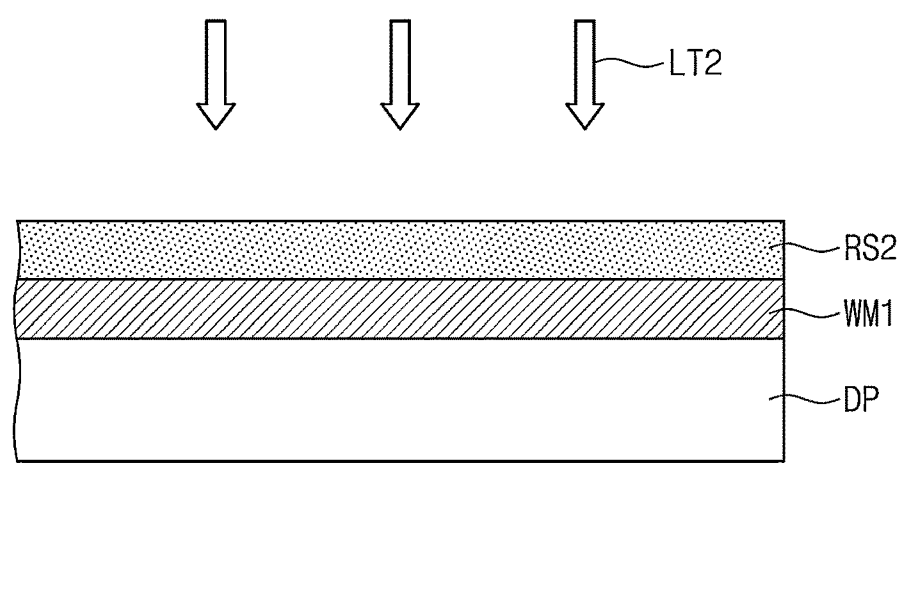
FIG. 9D is a graphic illustrating an operation of a method of manufacturing a display device according to an embodiment of the invention.
Figure 9E:
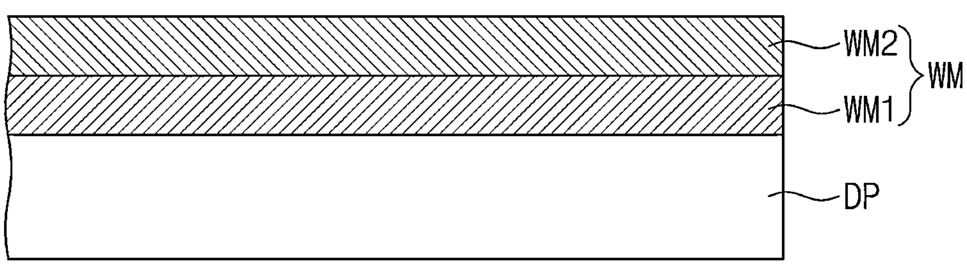
FIG. 9E is a graphic illustrating an operation of a method of manufacturing a display device according to an embodiment of the invention.
Figure 9E:
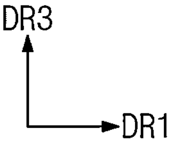

In an embodiment, FIG. 9D illustrates the curing of the applied second resin RS2, and FIG. 9E illustrates a state in which the window coating layer WM may be formed on the display panel DP. The window coating layer WM may include a cured first resin WM1 and a cured second resin WM2.

In an embodiment, in the curing of the applied second resin RS2, a second UV beam LT2 may be provided. Energy transferred to the second resin RS2 through the second UV beam LT2 may be controlled, so that the second resin RS2 has a predetermined position-curing rate distribution graph.

In an embodiment, energy of the first UV beam LT1 (see FIG. 9B) transferred to the first resin RS1 (see FIG. 9B) may be different from energy of the second UV beam LT2 transferred to the second resin RS2. That is, as previously described, by controlling the intensity of the UV beam, the velocity of the UV beam, the UV beam application cycle, and/or the curing time, etc., the energy transferred to the resins may differ from each other. Accordingly, the window coating layer WM, which has a lower-surface curing rate of about 10% to about 50% and an upper-surface curing rate of about 98%, and the curing rate of which increases along the thickness direction, may be formed. However, an embodiment is not limited thereto, and the window coating layer WM having a different position-curing rate distribution may be formed.

Figure 10A:
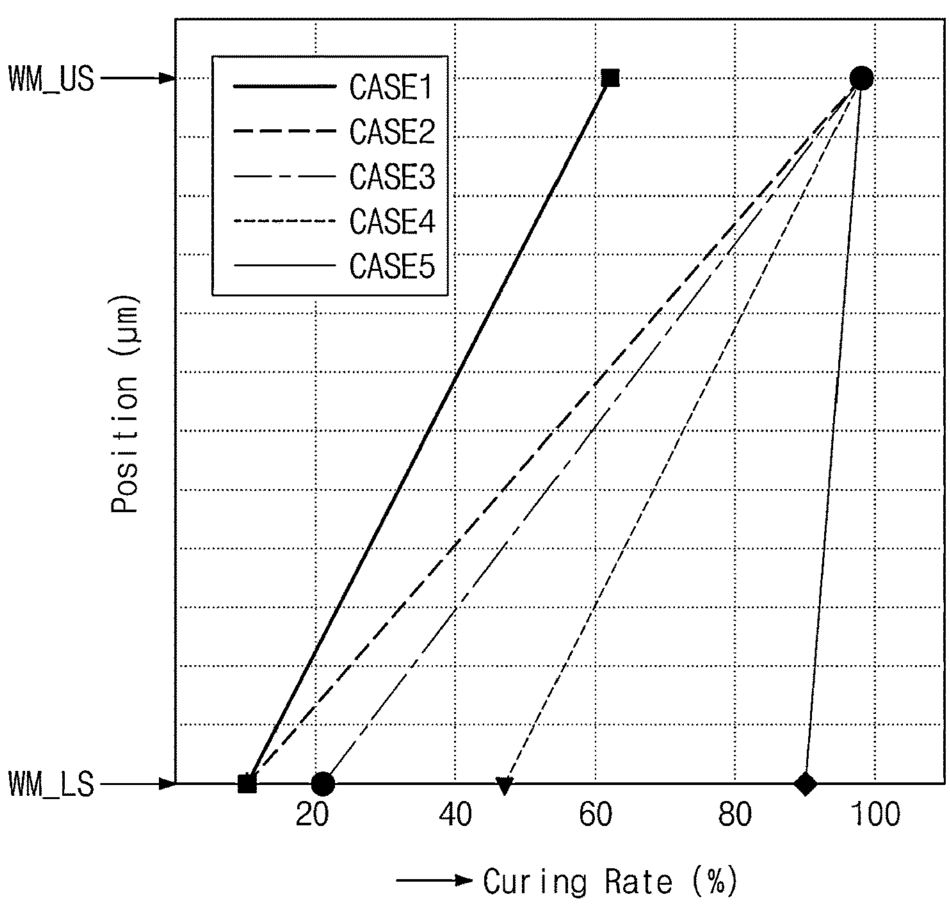
FIG. 10A is a graph showing a curing rate versus a position in a window coating layer according to an embodiment of the invention, along with a curing rate versus a position in each of window coating layers according to comparative examples.
Figure 10B:
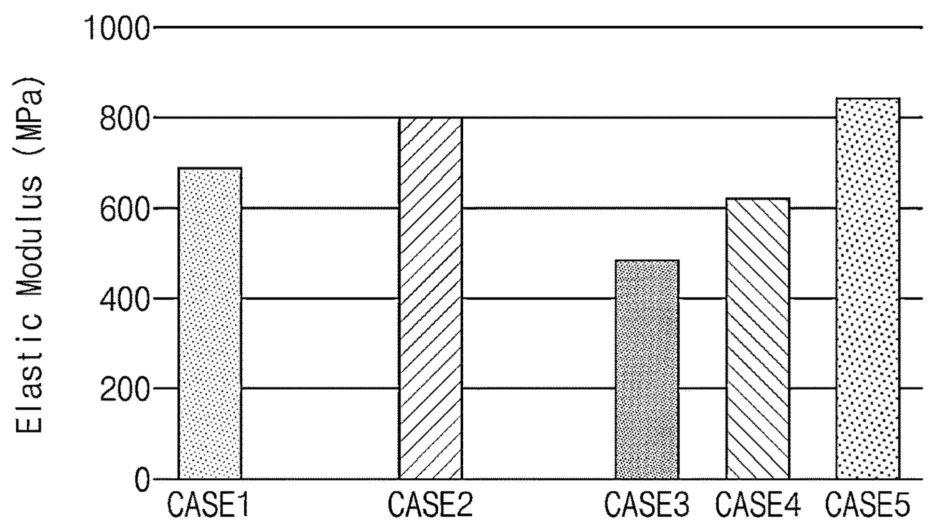
FIG. 10B is a graph showing respective elastic moduli of a window coating layer according to an embodiment of the invention along with window coating layers according to comparative examples.

FIG. 10A is a graph showing a curing rate versus a position in a window coating layer according to an embodiment and a curing rate versus a position in each of window coating layers according to comparative examples, and FIG. 10B is a graph showing respective elastic moduli of a window coating layer according to an embodiment and window coating layers according to comparative examples.

Referring to FIGS. 10A and 10B, the display device according to an embodiment may be same as or different from the display device according to the comparative examples in terms of curing rate versus position in the window coating layer. In addition, the elastic modulus of the window coating layer according to an embodiment may be same as or different from the elastic moduli of the window coating layers according to the comparative examples.

In an embodiment, in each of the CASES to be described as follows, the thickness T1 (see FIG. 3) of the window coating layer WM (see FIG. 3) is about 600 μm, and the applied resin may be cured through a UV beam. That is, the thickness between a lower surface WM_LS and an upper surface WM_US of the window coating layer WM (see FIG. 3) may be about 600 μm.

CASE 1 is an embodiment where an intensity of a UV beam applied to the applied resin is about 103 mW/cm2, a velocity of the UV beam is about 1 m/min, and a UV beam application cycle is once, and energy transferred to the applied resin is about 525 mJ/cm2.

CASE 2 is an embodiment where an intensity of a UV beam applied to the applied resin is about 211 mW/cm2, a velocity of the UV beam is about 2 m/min, and a UV beam application cycle is once, and energy transferred to the applied resin is about 541 mJ/cm2.

CASE 3 is an embodiment where an intensity of a UV beam applied to the applied resin is about 56 mW/cm2, a velocity of the UV beam is about 1 m/min, and a UV beam application cycle is once, and energy transferred to the applied resin is about 268 mJ/cm2.

CASE 4 is an embodiment where an intensity of a UV beam applied to the applied resin is about 58 mW/cm2, a velocity of the UV beam is about 1 m/min, and a UV beam application cycle is twice, and energy transferred to the applied resin is about 606 mJ/cm2.

CASE 5 is an embodiment where an intensity of a UV beam applied to the applied resin is about 56 mW/cm2, a velocity of the UV beam is about 1 m/min, a UV beam application cycle is four times, and energy transferred to the applied resin is about 1072 mJ/cm2.

In an embodiment and referring to FIGS. 4, 5, and 10A together, in CASE 1, the curing rate of the lower surface WM_LS of the window coating layer WM is about 10%, and the curing rate of the upper surface WM_US of the window coating layer WM is about 62%. In CASE 2, the curing rate of the lower surface WM_LS of the window coating layer WM is about 10%, and the curing rate of the upper surface WM_US of the window coating layer WM is about 98%. In CASE 3, the curing rate of the lower surface WM_LS of the window coating layer WM is about 21%, and the curing rate of the upper surface WM_US of the window coating layer WM is about 98%. In CASE 4, the curing rate of the lower surface WM_LS of the window coating layer WM is about 50%, and the curing rate of the upper surface WM_US of the window coating layer WM is about 98%. In CASE 5, the curing rate of the lower surface WM_LS of the window coating layer WM is about 90%, and the curing rate of the upper surface WM_US of the window coating layer WM is about 98%.

In an embodiment and referring to FIG. 10B, in CASE 1, the window coating layer WM may have an elastic modulus of about 700 Mpa. In CASE 2, the window coating layer WM may have an elastic modulus of about 800 Mpa. In CASE 3, the window coating layer WM may have an elastic modulus of about 500 Mpa. In CASE 4, the window coating layer WM may have an elastic modulus of about 630 Mpa, and in CASE 5, the window coating layer WM may have an elastic modulus of about 820 Mpa.

In an embodiment, as the elastic modulus is larger, the impact resistance and scratch resistance of the window coating layer may become improved, thereby improving durability of the window coating layer WM. In light of this result, the window coating layers WM in CASE 1, CASE 2, CASE4, and CASE 5 may have more improved durability than the window coating layer in CASE 3.

In an embodiment, in FIG. 10A, the position-curing rate change graph is illustrated as a straight line for the convenience, but an embodiment is not limited thereto. The position-curing rate change graph may be a curve.

Figure 11:
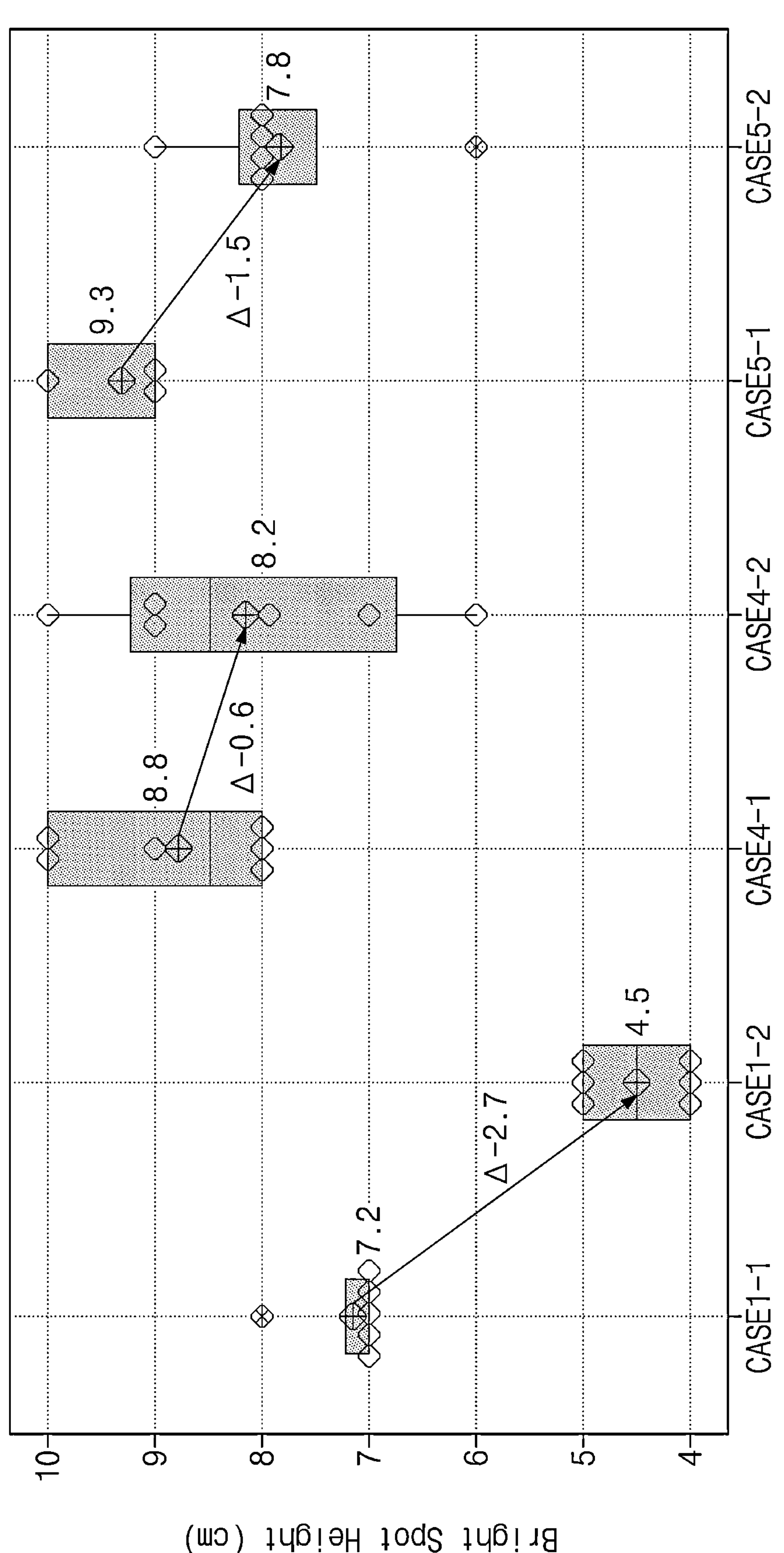
FIG. 11 is a graph showing respective bright spot heights of a window coating layer according to an embodiment of the invention along with window coating layers according to comparative examples.

FIG. 11 is a graph showing respective bright spot heights of a window coating layer WM according to an embodiment and window coating layers WM according to comparative examples.

In an embodiment, In each of the CASES to be described as follows, the thickness T1 (see FIG. 3) of the window coating layer WM (see FIG. 3) is about 480 μm, and the applied resin is cured through a UV beam.

In an embodiment, referring to FIGS. 4, 5, and 11 together, in CASE 1-1, CASE 4-1, and CASE 5-1, the window coating layer WM is provided with an adhesive layer or adhesive member thereunder. For example, the adhesive layer provided under the window coating layer WM may be an OCA. At this time, the thickness of the window coating layer WM is about 480 μm, and the thickness of the adhesive layer is about 150 μm.

In an embodiment, CASE 1-1 is where an intensity of the UV beam applied to the applied resin is about 103 mW/cm2, a velocity of the UV beam is about 1 m/min, and a UV beam application cycle is once, and energy transferred to the applied resin is about 525 mJ/cm2.

In an embodiment, In CASE 1-2, compared to CASE 1-1, the adhesive layer or adhesive member under the window coating layer WM is omitted, and only the window coating layer WM having a thickness of about 480 μm is present. In this case, the curing conditions are same as in CASE 1-1.

In an embodiment, CASE 4-1 is where an intensity of the UV beam applied to the applied resin is about 58 mW/cm2, a velocity of the UV beam is about 1 m/min, and a UV beam application cycle is twice, and energy transferred to the applied resin is about 606 mJ/cm2.

In an embodiment, In CASE 4-2, compared to CASE 4-1, the adhesive layer or adhesive member under the window coating layer WM is omitted, and only the window coating layer WM having a thickness of about 480 μm is present. In this case, the curing conditions are the same as in CASE 4-1.

In an embodiment, CASE 5-1 is where an intensity of the UV beam applied to the applied resin is about 56 mW/cm2, a velocity of the UV beam is about 1 m/min, and a UV beam application cycle is four times, and energy transferred to the applied resin is about 1072 mJ/cm2.

In an embodiment, in CASE 5-2, compared to CASE 5-1, the adhesive layer or adhesive member under the window coating layer WM is omitted, and only the window coating layer WM having a thickness of about 480 μm is present. In this case, the curing conditions are the same as in CASE 5-1.

In an embodiment, in each CASE, a bright spot height in a case where an OCA, as the adhesive layer, is present under the window coating layer WM and a bright spot height in a case where the OCA is omitted may be compared. The bright spot height is a numerical value for impact resistance of an object to be inspected, as measured through a free fall experiment such as a Dupont test, and as the bright spot height is greater, the durability is better.

In addition, in an embodiment, through the difference in bright spot height between the CASEs, the curing rate of a lower part of the window coating layer WM may be controlled, and when there is a small difference in bright spot height between the case where the adhesive layer is present and the case where the adhesive layer is omitted, respective CASEs may have similar impact resistance to each other.

In an embodiment, by using, as needed, the window coating layer WM including an adhesive layer thereunder or the window coating layer WM not including an adhesive layer thereunder while having the same impact resistance, degree of freedom in design of a display device may be increased. At this time, using the window coating layer WM having the same impact resistance but not including an adhesive layer thereunder to have a reduced entire thickness makes it possible to achieve an ultra-small display device. Moreover, since the thickness of the window coating layer WM becomes smaller, the required amount of materials may also be reduced, and thus the manufacturing cost of a display device may be lowered, and the process efficiency may be improved.

In an embodiment, the difference in bright spot height between CASE 1-1 and CASE 1-2 is about −2.7 cm, the difference in bright spot height between CASE 4-1 and CASE 4-2 is about −0.6 cm, and the difference in bright spot height between CASE 5-1 and CASE 5-2 is about −1.5 cm.

In an embodiment, the difference in bright spot height between CASE 4-1 and CASE 4-2 is smaller than the difference in bright spot height between CASE 1-1 and CASE 1-2. In addition, the difference in bright spot height between CASE 4-1 and CASE 4-2 is smaller than the difference in bright spot height between CASE 5-1 and CASE 5-2. In other words, CASE 4-1 and CASE 4-2 may have substantially similar impact resistances in both when the window coating layer WM includes an adhesive layer thereunder and when the window coating layer WM does not include the adhesive layer thereunder. Either CASE 4-1 and/or CASE 4-2 may be selected and used according to the needs of a design, and by selecting CASE 4-2, an ultra-small display device may be achieved, and the manufacturing cost of a display device may be lowered, thereby improving the process efficiency.

Figure 12:
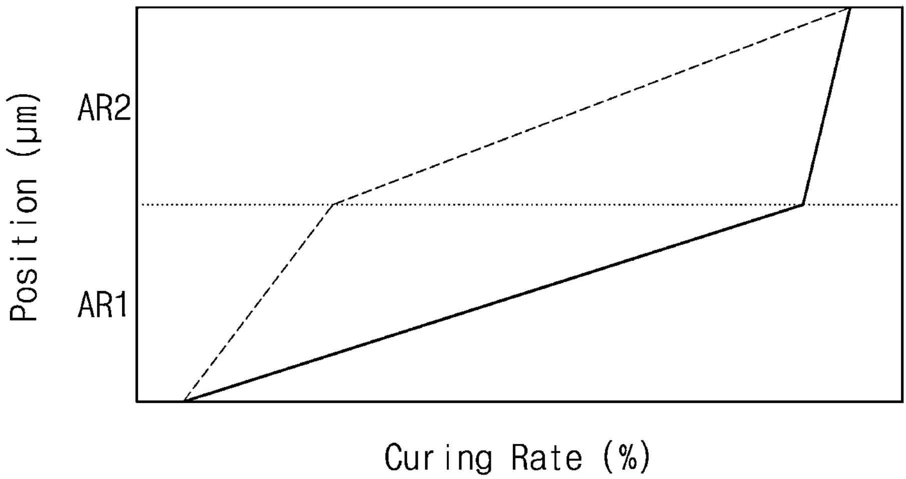
FIG. 12 is a graph showing a curing rate versus a position in a window coating layer according to an embodiment of the invention.

FIG. 12 is a graph showing a curing rate versus a position in a window coating layer according to an embodiment.

Referring to FIGS. 9E and 12 together, a window coating layer WM according to an embodiment may have a plurality of layers. A first region AR1 and a second region AR2 of the window coating layer may be defined as different layers.

For example, in an embodiment, the first region AR1 and the second region AR2 of the window coating layer WM may have the same materials. In this case, the material of the first region AR1 and the material of the second region AR2 may be cured under different curing conditions, and thus the first and second regions AR1 and AR2 may have different position-curing rate change graphs.

In an embodiment and referring to the drawing, the position-curing rate change graph may be formed as a solid line. However, an embodiment is not limited thereto, and the graph may be formed as a dotted line.

As another example, in an embodiment, the first region AR1 and the second region AR2 of the window coating layer WM may have different materials. In this case, the materials of the first region AR1 and the second region AR2 may be cured under the same curing conditions or under different curing conditions, and the first and second regions AR1 and AR2 may have different position-curing rate change graphs.

In an embodiment, a cured first resin WM1 may be positioned in the first region AR1, and a cured second resin WM2 may be positioned in the second region AR2. At this time, the cured first resin WM1 and the cured second resin WM2 may include the same materials, may be cured under different curing conditions to have different position-curing rate change graphs.

Alternatively, in an embodiment, the cured first resin WM1 and the cured second resin WM2 may have different materials, may be cured under the same or different curing conditions, and may have different position-curing rate change graphs.

In an embodiment, by controlling the material included in each of a plurality of resins or the curing conditions thereof, as previously described, the difference in bright spot height, between the case where an adhesive layer is present under the window coating layer WM and the case where the adhesive layer is not, may be lowered, so that the window coating layers WM in the respective cases may have similar impact resistance. Accordingly, an ultra-small display device may be achieved, the manufacturing cost of a display device may be reduced, and the process efficiency may be improved.

In an embodiment and in FIG. 12, unlike what is described with reference to FIG. 5, the third region AR3 (see FIG. 5) is omitted. However, an embodiment is not limited to what is illustrated in the drawing, and the third region AR3 (see FIG. 5) may be positioned between the first region AR1 and the second region AR2. In addition, the window coating layer WM including the third region AR3 may have a different material from the first region AR1 or the second region AR2, and even if the third region AR3 has the same material, the third region AR3 may have a different position-curing rate change graph due to different curing conditions.

According to a display device and a method of manufacturing the display device according to an embodiment, the impact resistance of a window coating layer WM may be improved by controlling the curing rate of a lower surface of the window coating layer WM.

According to a display device and a method of manufacturing the display device according to an embodiment, the impact resistance of a window coating layer WM may be maintained even when the window coating layer WM has a smaller thickness.

A display device and a method of manufacturing the display device according to an embodiment may enable the manufacturing cost of a display device to be reduced and the process efficiency to be improved.

Although the present disclosure has been described with reference to embodiments of the invention, it will be understood that the invention should not be limited to these embodiments but various changes and modifications can be made by those skilled in the art without departing from the spirit and scope of the present disclosure. Accordingly, the technical scope of the invention is not intended to be limited to the contents set forth in the detailed description of the specification, but is intended to be defined by the appended claims. Moreover, the embodiments or parts of the embodiments may be combined in whole or in part without departing from the scope of the invention.

What is claimed is:

1. A display device comprising:

a display panel; and a window coating layer including a lower surface in contact with an upper surface of the display panel, and an upper surface opposed to the lower surface, wherein the window coating layer has a curing rate which increases along a thickness direction, and the lower surface has a curing rate of about 10% to about 50%, and the upper surface has a curing rate of about 98% or less.

2. The display device of claim 1, wherein the window coating layer is divided along the thickness direction into a first region and a second region, wherein the first region includes the lower surface and the second region includes the upper surface, wherein the first region has an elastic modulus of about 1 MPa to about 100 MPa, and the second region has an elastic modulus of about 1 GPa to about 10 GPa.

3. The display device of claim 2, wherein the elastic modulus of the second region increases toward the upper surface.

4. The display device of claim 2, wherein the elastic modulus of the first region increases toward the second region.

5. The display device of claim 2, wherein the first region and the second region are comprise of different materials.

6. The display device of claim 1, wherein the window coating layer is a single layer.

7. The display device of claim 1, wherein the window coating layer has a thickness of about 480 μm to about 630 μm.

8. The display device of claim 1, wherein the display panel comprises:

a base layer;

a pixel layer disposed on the base layer, and configured to display an image;

an input-sensing layer disposed on the pixel layer; and an anti-reflection layer disposed on the pixel layer, wherein at least one of the input-sensing layer and the anti-reflection layer defines an outermost layer of the display panel, and the window coating layer is directly disposed on an upper surface of the outermost layer of the display panel.

9. A method of manufacturing a display device, the method comprising:

applying a resin onto a display panel; and curing the resin to provide a window coating layer, wherein the curing of the resin is performed such that a lower surface of the window coating layer which is in contact with an upper surface of the display panel, has a curing rate of about 10% to about 50%.

10. The method of claim 9, wherein the curing the resin comprises controlling energy transferred to the resin.

11. The method of claim 10, wherein in the controlling energy transferred to the resin, the energy transferred is controlled such that an upper surface of the window coating layer has a curing rate of about 98% or less.

12. The method of claim 11, wherein the applying a resin onto the display panel comprises applying a first resin onto the display panel, and applying a second resin onto the first resin to cover the first resin, and the curing the resin comprises curing the first resin by transferring energy to the first resin after applying the first resin and before applying the second resin, and curing the second resin by transferring energy to the second resin after applying the second resin.

13. The method of claim 12, wherein the first resin and the second resin are comprised of different materials.

14. The method of claim 12, wherein the energy transferred to the first resin and the energy transferred to the second resin differ from each other.

15. The method of claim 10, wherein in the controlling energy transferred to the resin, the energy transferred is controlled so that the curing rate of the window coating layer increases along a direction which is directed away from the upper surface of the display panel.

16. The method of claim 10, wherein the lower surface of the window coating layer has a curing rate of about 50%, and an upper surface of the window coating layer has a curing rate of about 98%.

17. The method of claim 10, wherein in the curing the resin, the resin is cured through a UV beam, and the energy transferred to the resin changes depending on at least one of an intensity of the UV beam applied to the resin, a velocity of the UV beam, a UV beam application cycle, and a curing time for the resin.

18. The method of claim 17, wherein the UV beam application cycle is at least twice.

19. A method of manufacturing a display device, the method comprising:

applying a resin onto a display panel; and curing the resin to provide a window coating layer that is a single layer, wherein the curing the resin is performed such that a lower surface of the window coating layer which is in contact with an upper surface of the display panel, has a curing rate of about 10% to about 50%, and an upper surface of the window coating layer has a curing rate of about 98% or less.

20. The method of claim 19, wherein in the curing the resin, the curing rate of the window coating layer increases along a direction which is directed away from the upper surface of the display panel.

* * * * *